United States Patent [19]

Suenaga et al.

[11] Patent Number: 5,363,122
[45] Date of Patent: Nov. 8, 1994

[54] SYSTEM FOR CONTROLLING A DISPLAY PROVIDED ON A CAR STEREO

[75] Inventors: Syoji Suenaga; Masahiro Suzuki; Masashi Iwasaki, all of Saitama, Japan

[73] Assignee: Pioneer Electronic Corporation, Tokyo, Japan

[21] Appl. No.: 909,842

[22] Filed: Jul. 7, 1992

[30] Foreign Application Priority Data

Jan. 6, 1992 [JP] Japan .................... 4-018299

[51] Int. Cl.⁵ .................................... G11B 33/00
[52] U.S. Cl. .................... 345/212; 345/904; 455/343; 455/346
[58] Field of Search .......... 340/700, 715, 813, 811; 455/345, 346, 347, 348, 349, 343; 361/422, 58; 345/904, 212, 117; 307/10.1

[56] References Cited

U.S. PATENT DOCUMENTS

| | | | |
|---|---|---|---|
| 4,291,412 | 9/1981 | Imazeki | 340/811 |
| 4,680,674 | 7/1987 | Moore | 340/700 |
| 4,806,784 | 2/1989 | Goda | 340/811 |
| 4,848,876 | 7/1989 | Yamakawa | 340/813 |
| 5,077,551 | 12/1991 | Saitou | 340/700 |
| 5,173,686 | 12/1992 | Fujihara | 340/700 |
| 5,179,492 | 1/1993 | Kato et al. | 361/58 |

*Primary Examiner*—Ulysses Weldon
*Assistant Examiner*—Kara A. Farnandez
*Attorney, Agent, or Firm*—Nikaido, Marmelstein, Murray & Oram

[57] ABSTRACT

A car stereo has a detachable grille attached to a body of the car stereo. The grille has a power input terminal connected to a power supply terminal of the body, a data input terminal connected to a data output terminal of the body, a display, and a microcomputer for operating the display to display data in accordance with data signal applied from the body through the data terminals. Disconnection of the data input terminal from the data output terminal under the condition of the connection between the power input terminal and the power output terminal is detected. At the disconnection, the microcomputer stops the operation of the display.

3 Claims, 4 Drawing Sheets

SYSTEM FOR CONTROLLING A DISPLAY PROVIDED ON A CAR STEREO

BACKGROUND OF THE INVENTION

The present invention relates to a car stereo provided with a detachable grille, and more particularly to a system for preventing the erroneous operation of a display when detaching the grille.

Increase in the use of sophisticated car stereo in recent years has caused an increase in the amount of theft of these stereos. In order to prevent the theft of the stereo, there has been many proposals. In accordance with one of the proposals, a detachable grille having a plurality of push buttons for control of the stereo is attached to the body of the stereo.

FIG. 1 shows the above described prior art. The car stereo comprises a car stereo body 10 and a detachable grille 20 attached to the body 10. The body 10 has recessed panel 11 mounted at the front thereof. The panel 11 has a cassette opening 14. A detector switch 15 is provided on an upper left hand side of the grille 20 to mechanically detect the attachment of the grille 20 on the body 10. A connector 12 which is connected to a connector 21 (FIG. 2) provided at the back of the grille 20 when the grille is attached, are formed on the panel 11. The grille 20 has a cassette opening 24 which coincides with the cassette opening 14 of the body 10 and various operation keys 22. A display 23 is disposed at a central portion of the grille 20 so as to indicate information such as current time and the received frequency of the stereo.

Referring to FIGS. 2 the connector 12 of the body 10 has a 5 V supply terminal 12a, data input/output terminal 12b, 8 V supply terminal 12c, and ground terminal 12d. The terminals 12a and 12c are connected to a 5 V supply circuit 17 and an 8 V supply circuit 18, respectively, through a protection circuit 16. The data input/output terminal 12b is connected to a microcomputer 19. The microcomputer 19 is connected to the detector switch 15 so as to operate the protection circuit 16 in accordance with the operating state of the switch 15. More particularly, when the grille 20 is detached, the switch 15 is opened, so that the protection circuit 16 stops the supply of voltage from the 5 V supply circuit 17 and 8 V supply circuit 18 to the terminals 12a and 12c. Thus, the car stereo circuitry provided in the body 10 is protected from damage which is caused by either the short-circuiting of the exposed terminals 12a to 12d or by static applied to the terminals.

The connector 21 of the grille 20 has terminals which correspond to the terminals 12a to 12d of the connector 12. Namely, there is provided a 5 V input terminal 21a, data input/output terminal 21b, 8 V input terminal 21c, and ground terminal 21d. The terminal 21a is connected to a microcomputer 25 so as to supply a 5 V voltage thereto. The microcomputer 25 receives data from the microcomputer 19 through the data input/output terminals 12b and 21b dependent on the operation of the operation keys 22 on the grille 20, such as the time and the frequency of the radio. The microcomputer 25 applies a control signal to a display driver 26 to indicate the received data on the display 23. The 8 V input terminal 21c is connected to a lamp 27 for lighting the display 23.

When the grille 20 is attached to the body 10, the terminals 21a to 21d of the connector 21 are connected to the respective terminals 12a to 12d of the connector 12. At the same time, the detector switch 15 is closed, so that the microcomputer 19 operates to release the operation of the protection circuit 16. Accordingly, the 5 V supply circuit 17 and the 8 V supply circuit 18 are connected to the microcomputer 25 and the lamp 27, respectively, thereby operating them. The microcomputer 25 is applied with various data from the microcomputer 19 through the terminals 12b and 21b, so that, the microcomputer 25 operates to drive the display 23, thereby indicating information on the display 23.

On the contrary, when the grille 20 is detached, the detector switch 15 is opened. As a result, the microcomputer 19 renders the protection circuit 16 operative, so that the supply of the voltage to the terminals 12a and 12c is stopped. The microcomputer 19 also stops feeding the data to the microcomputer 25. Thus the display 23 of the grille 20 does not show information.

In such a device, it may occur that the contacts of the terminals 21a to 21d with the terminals 12a to 12d chatter when the grille is detached. If the detector switch 15 is opened before the contact chattering, or the power input terminal 21a is removed from the terminal 12a before the chattering of the contacts between terminals 21b and 12b, there is no trouble, because of the reset of the microcomputer 19 or 25 due to the stop of the power supply. However, if the contact of the terminal 21b with the terminal 12b chatters under the connection between the terminals 12a and 21a, random signals are supplied to the microcomputer 25, which may cause an erroneous display or flickering of the display 23.

SUMMARY OF THE INVENTION

An object of the present invention is to provide a system which may prevent an erroneous display of a grille.

According to the present invention, there is provided a system for controlling a display provided on a car stereo having a detachable grille attached to a body of the car stereo, the grille having a power input terminal connected to a power supply terminal of the body, a data input terminal connected to a data output terminal of the body, a display, and a microcomputer for operating the display to display data in accordance with data signal applied from the body through the data terminals.

The system comprises detector means for detecting disconnection of the data input terminal from the data output terminal under the condition of the connection between the power input terminal and the power output terminal and for producing a disconnection signal, and means provided in the microcomputer for stopping the operation of the display in response to the disconnection signal.

In an aspect of the invention, the detector means comprises a circuit for applying a constant voltage to the microcomputer as long as the power input terminal is connected to the power output terminal, and determining means for determining the constant voltage and for producing the disconnection signal.

The other objects and features of this invention will become understood from the following description with reference to the accompanying drawings.

DETAILED DESCRIPTION OF THE PREFERRED EMBODIMENTS

Figure 1:
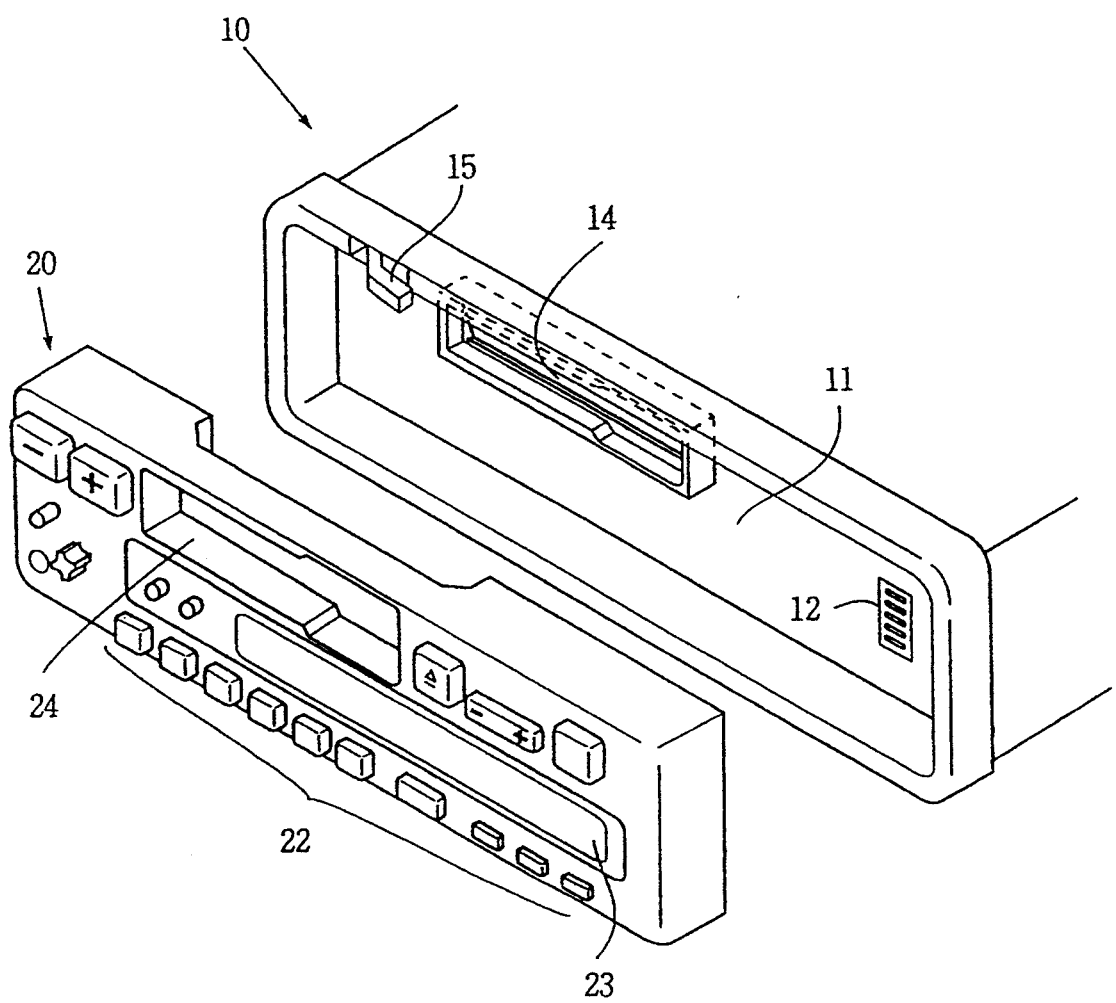
FIG. 1 is a perspective view of a car stereo having a detachable grille.
Figure 2:
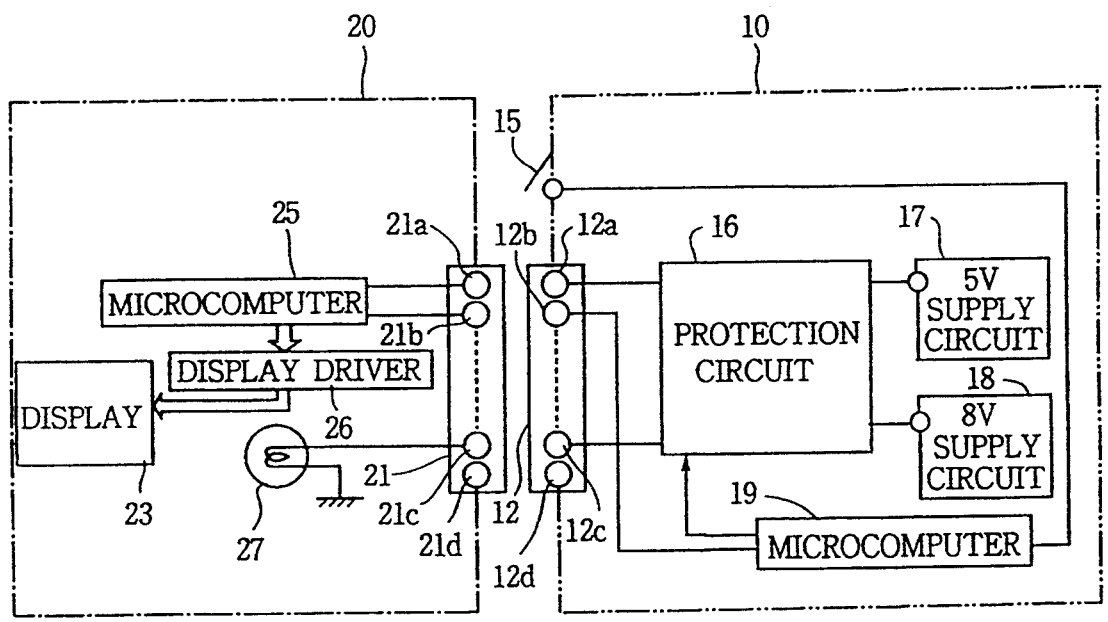
FIG. 2 is a block diagram of a control circuit provided in a body and a grille of a conventional car stereo.

A system for controlling the display of the grille is applied to the conventional car stereo shown and described with reference to FIG. 1 so that further description of the construction of the car stereo is omitted. Furthermore, the part of the system mounted in the body is identical to that shown in FIG. 2, and therefore, the illustration thereof is omitted in FIG. 3.

Figure 3:
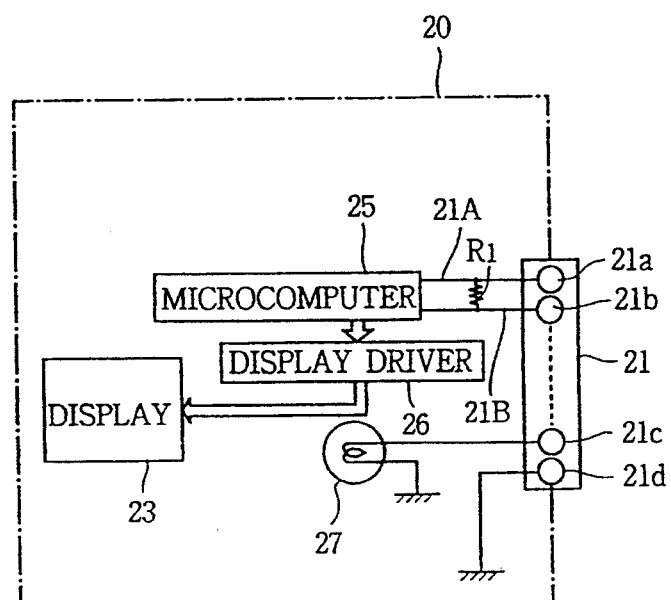
FIG. 3 is a block diagram showing a part of a control circuit of the present invention, provided in the grille.

Referring to FIG. 3, the microcomputer 25 in the grille 20 is connected to the 5 V input terminal 21a through a line 21A and to the data input/output terminal 21b through the terminal 21b and a line 21B. The line 21A is connected to the line 21B through a pullup resistor R1. The microcomputer 25 is further connected to the display 23 through the display driver 26. The 8 V input terminal 21c is connected with the lamp 27 as in the control circuit shown in FIG. 2.

Figure 4:
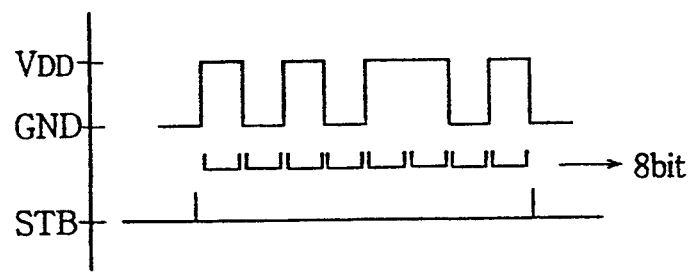
FIG. 4 is a graph showing a normal data pulse.

The operation of the system is described hereinafter with reference to FIGS. 4 to 6. When the grille 20 is correctly attached to the body 10, the terminals 21a to 21d are connected to the terminals 12a to 12d of the connector 12 on the body 10, respectively. Thus, the microcomputer 25 is applied with 5 V from the 5 V supply circuit 17 through terminals 12a and 21a and the line 21A. The lamp 27 is supplied with the voltage of 8 V from the 8 V supply circuit 18 so as to be lighted. The microcomputer 25 further receives data from the microcomputer 19 through the terminals 12b, 21b and the line 21B in accordance with the operation of the operation keys 22.

Figure 5:
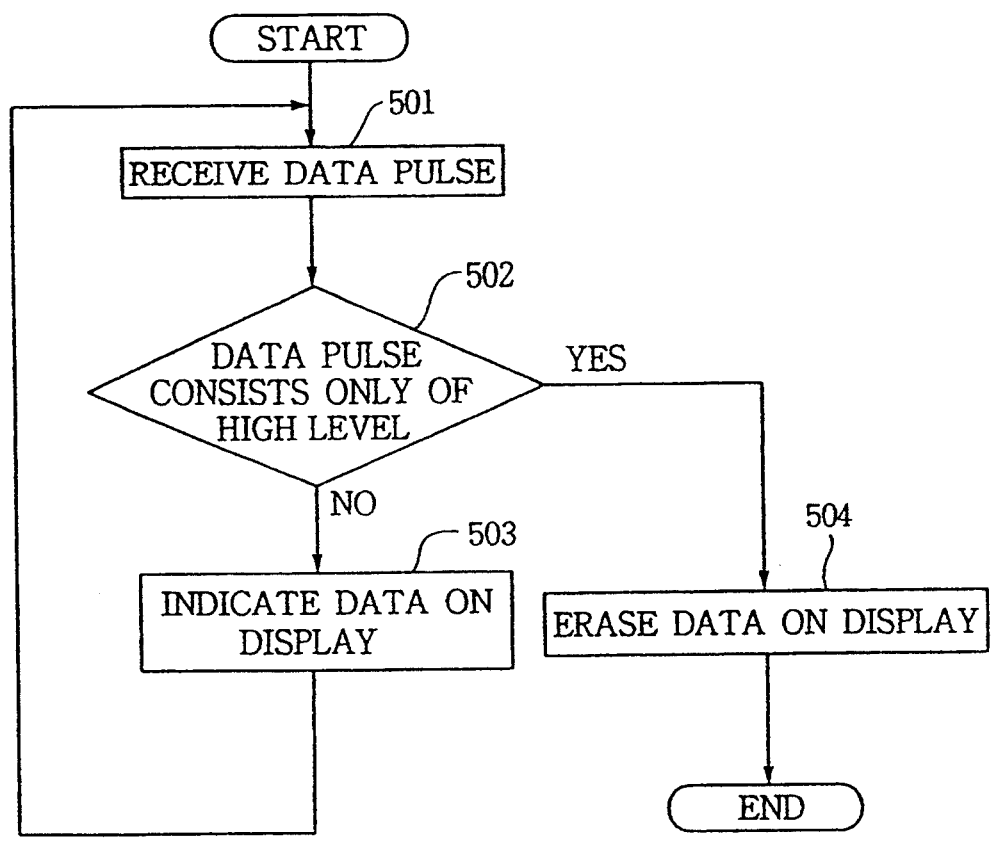
FIG. 5 is a flowchart showing the operation of the present invention.

Referring to FIG. 5 showing the operation of the microcomputer 25 for controlling the display 23, after the microcomputer 25 receives the data from the microcomputer 19 at a step 501, the condition of the signal representing the data is checked at a step 502. Namely, the data is supplied in the form of pulses consisting a voltage which increases from zero or ground voltage GND to a maximum voltage VDD and then decreases from the maximum to zero as shown in FIG. 4. The microcomputer 25 generates strobe pulses consisting of 8 bits. The level of the data pulses between adjacent bits is checked. The normal signal comprises pulses. Therefore, at the step 502, if it is determined that the input data comprises pulses as shown in FIG. 4, the microcomputer 25 determines that the correct data is being transmitted to the input port thereof. The program proceeds to a step 503 where the microcomputer 25 continues to indicate the data on the display 23.

Figure 6:
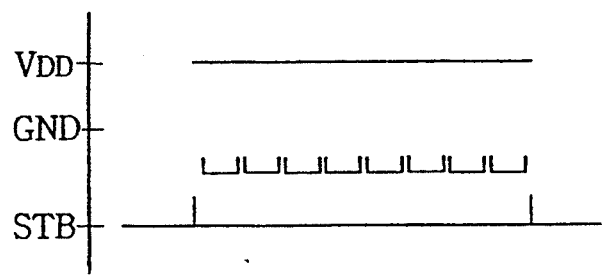
FIG. 6 is a graph showing an abnormal data pulse which is generated in the circuit of the present invention.

However, if the terminal 21b is disconnected from the terminal 12b under the connection between terminals 12a and 21a, the level of the input of the microcomputer becomes a high level (VDD) because of the pullup resistor R1 as shown in FIG. 6. In other words, all levels of 8 bits become high, which means that the received data is FF in the sexadecimal notation. Therefore, if the received data is FF at the step 502, it is determined that an inappropriate data is supplied to the microcomputer.

The program thereafter goes to a step 504 where the microcomputer 25 stops applying the control signal to the display driver 26. Hence no indication is displayed on the display 23. The display 23 is accordingly prevented from showing erroneous data.

Figure 7:
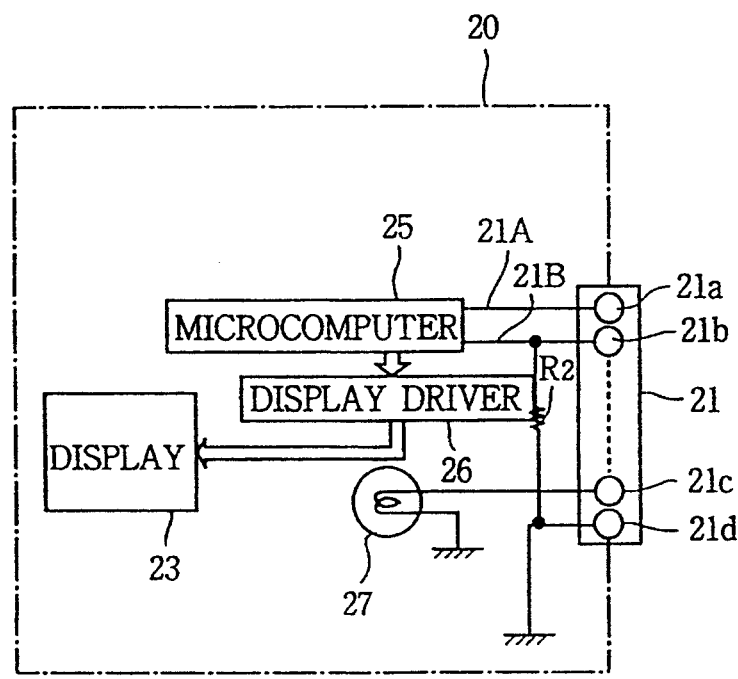
FIG. 7 is a block diagram showing a second embodiment of the control circuit of the present invention.
Figure 8:
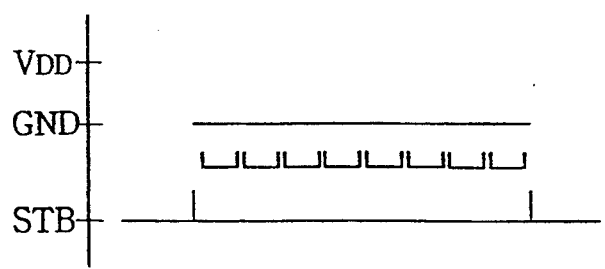
FIG. 8 is a graph showing an abnormal data pulse generated in the circuit shown in FIG. 7.

Referring to FIG. 7 showing the second embodiment of the present invention, the control circuit differs from that of FIG. 3 in that the line 21B is grounded through a pulldown resistor R2. When the data input/output terminal 21b is disconnected from the data input/output terminal 12b, the input level is pulled down to the ground level GND as shown in FIG. 8. Therefore, when the microcomputer 25 determines that the received data is OO at the step 502, the display 23 is not operated.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A system for controlling a display provided on a car stereo having a detachable grille attached to a body of the car stereo, the grille having a power input terminal connected to a power supply terminal of the body, a data input terminal connected to a data output terminal of the body, a display, and a microcomputer for operating the display to display data in accordance with data signal applied from the body through the data terminals, the system comprises:

detector means for detecting disconnection of the data input terminal from the data output terminal when the power input terminal and the power output terminal are connected and for producing a disconnection signal wherein the detector means comprises a circuit, provided between the data input terminal and a constant voltage point, for applying a constant voltage to the microcomputer as long as the power input terminal is connected to the power output terminal and the data input terminal is disconnected from the data output terminal, and determining means for determining the constant voltage and for producing the disconnection signal; and means provided in the microcomputer for stopping operation of the display in response tot he disconnection signal.

2. The system according to claim 1 wherein the circuit includes a pullup resistor provided between the power input terminal and the data input terminal.

3. The system according to claim 1 wherein the circuit includes a pulldown resistor provided between the data input and a ground.

* * * * *